(12) United States Patent
Eugene Lee et al.

(10) Patent No.: US 11,056,462 B2
(45) Date of Patent: Jul. 6, 2021

(54) LOCKING DUAL LEADFRAME FOR FLIP CHIP ON LEADFRAME PACKAGES

(71) Applicant: Texas Instruments Incorporated, Dallas, TX (US)

(72) Inventors: Lee Han Meng @ Eugene Lee, Johor (MY); Wei Fen Sueann Lim, Melaka (MY); Anis Fauzi Bin Abdul Aziz, Kegah (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 366 days.

(21) Appl. No.: 15/645,272

(22) Filed: Jul. 10, 2017

(65) Prior Publication Data

US 2017/0309595 A1    Oct. 26, 2017

Related U.S. Application Data

(63) Continuation of application No. 14/017,800, filed on Sep. 4, 2013, now abandoned.

(51) Int. Cl.
*H05K 1/11* (2006.01)
*H05K 1/18* (2006.01)
(Continued)

(52) U.S. Cl.
CPC ........ *H01L 24/97* (2013.01); *H01L 23/49537* (2013.01); *H01L 23/49551* (2013.01);
(Continued)

(58) Field of Classification Search
CPC ............... H01L 24/97; H01L 23/49575; H01L 23/49551; H01L 23/49537; H01L 23/49555; H01L 2924/3511; H01L 2924/181; H01L 2224/83385; H01L 2224/81385; H01L 2224/97; H01L 2224/2919; H01L 24/13; H01L 24/03; H01L 2224/83201; H01L 2224/33181; H01L 2224/32013; H01L 2224/83203; H01L 24/16; H01L 2224/83192;
(Continued)

(56) References Cited

U.S. PATENT DOCUMENTS 3,778,887 A    12/1973    Suzuki et al.
5,225,897 A     7/1993    Reifel et al.
(Continued)

*Primary Examiner* — Ishwarbhai B Patel
(74) *Attorney, Agent, or Firm* — Dawn Jos; Charles A. Brill; Frank D. Cimino

(57) ABSTRACT

A method of assembling a flip chip on a leadframe package. A locking dual leadframe (LDLF) includes a top metal frame portion including protruding features and a die pad and a bottom metal frame portion having apertures positioned lateral to the die pad. The protruding features and apertures are similarly sized and alignable. A flipped integrated circuit (IC) die having a bottomside and a topside including circuitry connected to bond pads having solder balls on the bond pads is mounted with its topside onto the top metal frame portion. The top metal frame portion is aligned to the bottom metal frame portion so that the protruding features are aligned to the apertures. The bottomside of the IC die is pressed with respect to a top surface of the bottom frame portion, wherein the protruding features penetrate into the apertures.

20 Claims, 8 Drawing Sheets

(51) Int. Cl.
*H01L 23/00* (2006.01)
*H01L 23/495* (2006.01)

(52) U.S. Cl.
CPC .. *H01L 23/49555* (2013.01); *H01L 23/49575* (2013.01); *H05K 1/181* (2013.01); *H01L 23/49503* (2013.01); *H01L 24/13* (2013.01); *H01L 24/16* (2013.01); *H01L 24/29* (2013.01); *H01L 24/32* (2013.01); *H01L 24/33* (2013.01); *H01L 24/73* (2013.01); *H01L 24/83* (2013.01); *H01L 24/92* (2013.01); *H01L 2224/131* (2013.01); *H01L 2224/16245* (2013.01); *H01L 2224/2919* (2013.01); *H01L 2224/32013* (2013.01); *H01L 2224/32245* (2013.01); *H01L 2224/33181* (2013.01); *H01L 2224/73204* (2013.01); *H01L 2224/73253* (2013.01); *H01L 2224/81385* (2013.01); *H01L 2224/81815* (2013.01); *H01L 2224/83192* (2013.01); *H01L 2224/83201* (2013.01); *H01L 2224/83203* (2013.01); *H01L 2224/83385* (2013.01); *H01L 2224/92242* (2013.01); *H01L 2224/97* (2013.01); *H01L 2924/00012* (2013.01); *H01L 2924/00014* (2013.01); *H01L 2924/181* (2013.01); *H01L 2924/3511* (2013.01); *H05K 1/111* (2013.01); *Y10T 29/49121* (2015.01)

(58) Field of Classification Search
CPC ........... H01L 24/32; H01L 2224/81815; H01L 24/83; H01L 2224/16245; H01L 2224/73253; H01L 2224/131
See application file for complete search history.

(56) References Cited

U.S. PATENT DOCUMENTS

| | | | |
|---|---|---|---|
| 5,334,872 A | 8/1994 | Ueda et al. | |
| 6,373,078 B1 | 4/2002 | Yea | |
| 6,777,786 B2* | 8/2004 | Estacio | H01L 23/49562 257/666 |
| 6,917,097 B2 | 7/2005 | Chow et al. | |
| 6,965,157 B1 | 11/2005 | Perez et al. | |
| 7,071,033 B2* | 7/2006 | Estacio | H01L 24/40 438/123 |
| 7,635,613 B2* | 12/2009 | Lange | H01L 21/565 257/675 |
| 8,564,110 B2* | 10/2013 | Xue | H01L 23/49513 257/676 |
| 8,975,733 B2 | 3/2015 | Sato et al. | |
| 2006/0289971 A1* | 12/2006 | Lange | H01L 21/565 257/666 |
| 2008/0054438 A1 | 3/2008 | Germain et al. | |
| 2008/0087992 A1* | 4/2008 | Shi | H01L 23/49524 257/670 |
| 2008/0122049 A1 | 5/2008 | Zhao et al. | |
| 2008/0224285 A1 | 9/2008 | Lim et al. | |
| 2009/0057852 A1* | 3/2009 | Madrid | H01L 23/4334 257/670 |
| 2009/0166828 A1 | 7/2009 | Upadhyayula et al. | |
| 2010/0148327 A1 | 6/2010 | Madrid | |
| 2012/0286405 A1* | 11/2012 | Toyota | H01L 23/3107 257/666 |

* cited by examiner

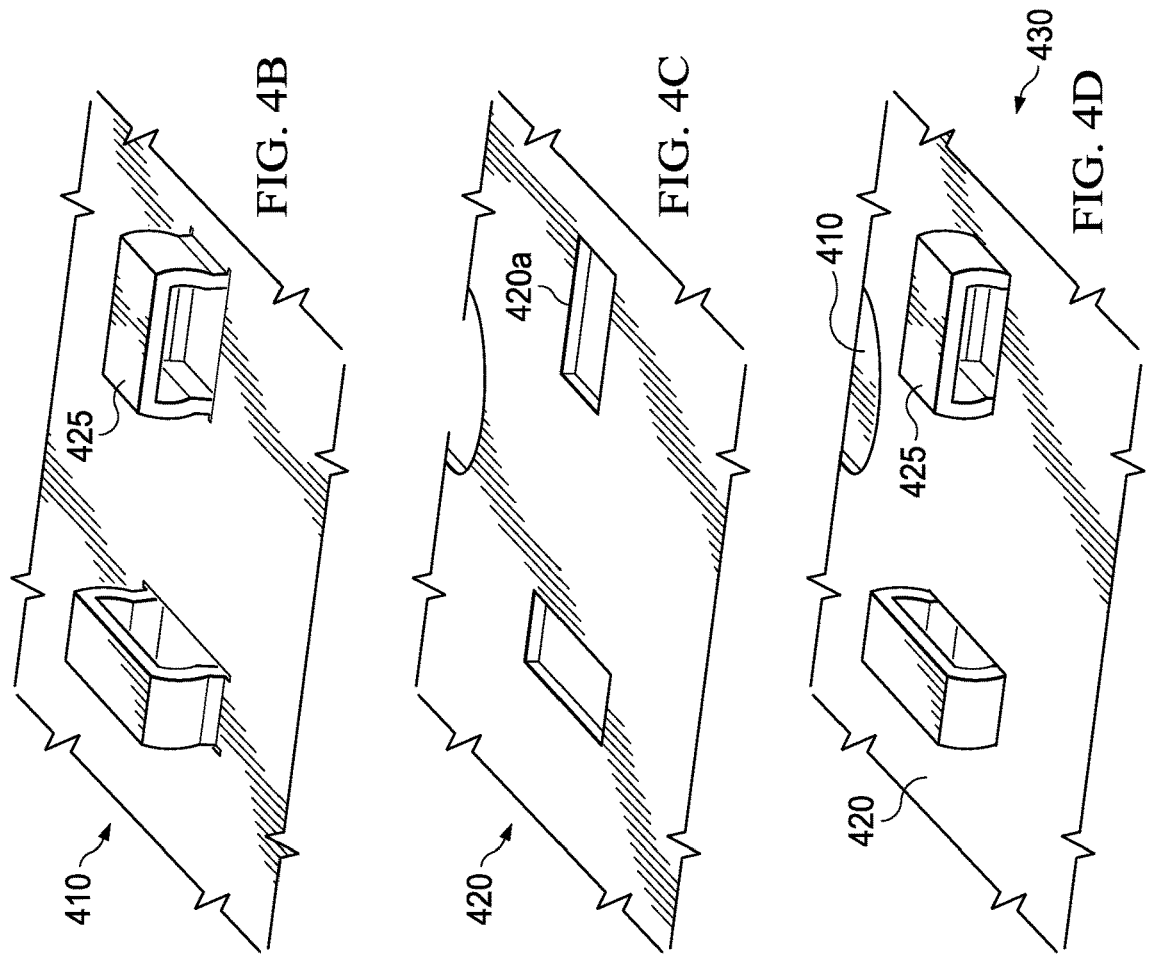
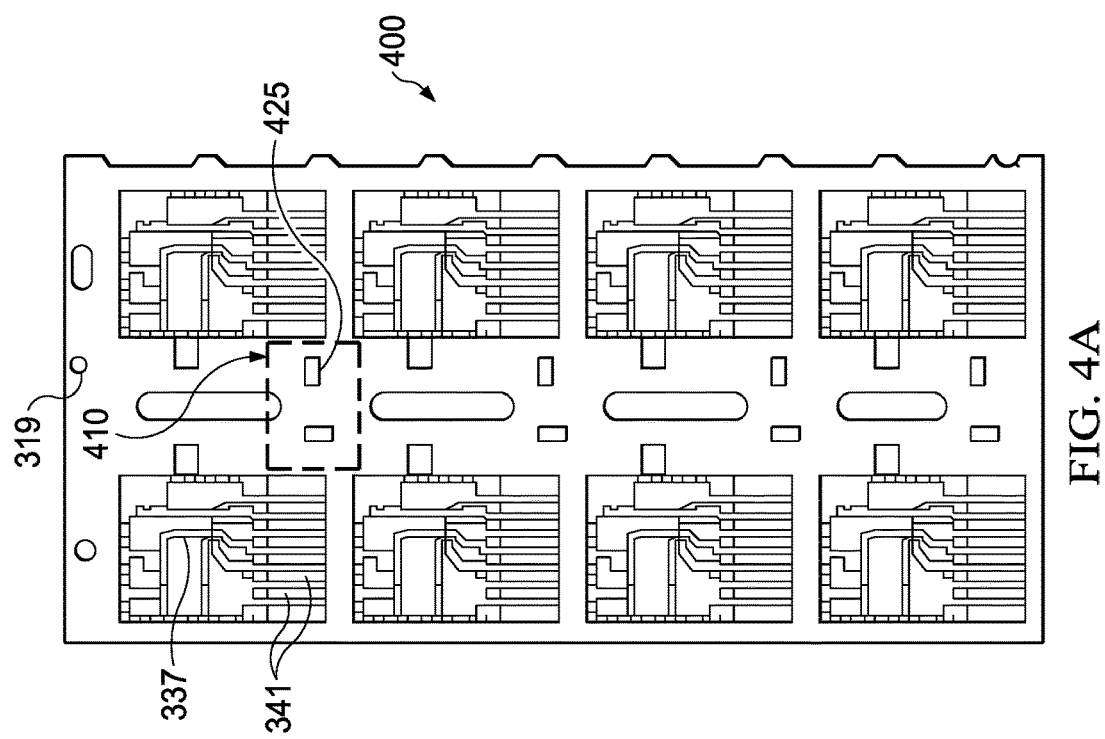

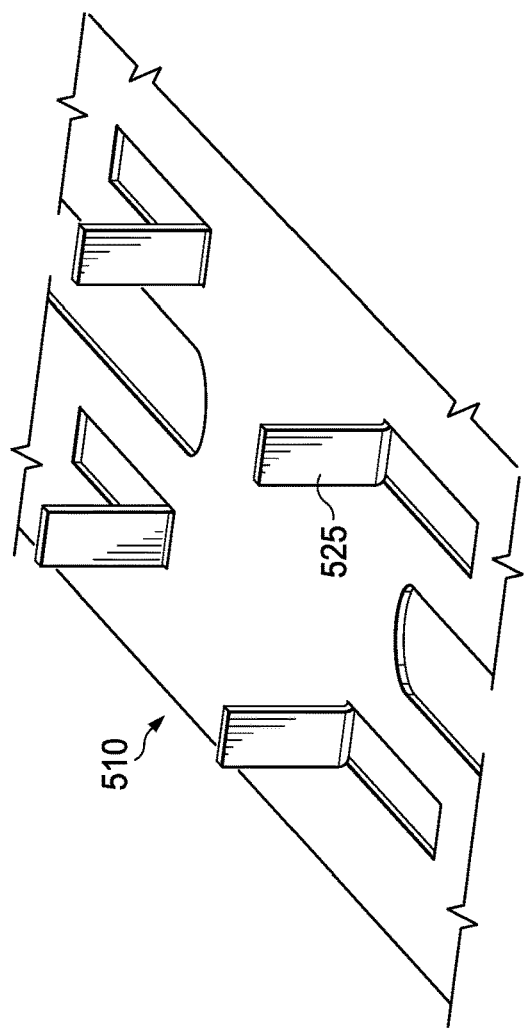
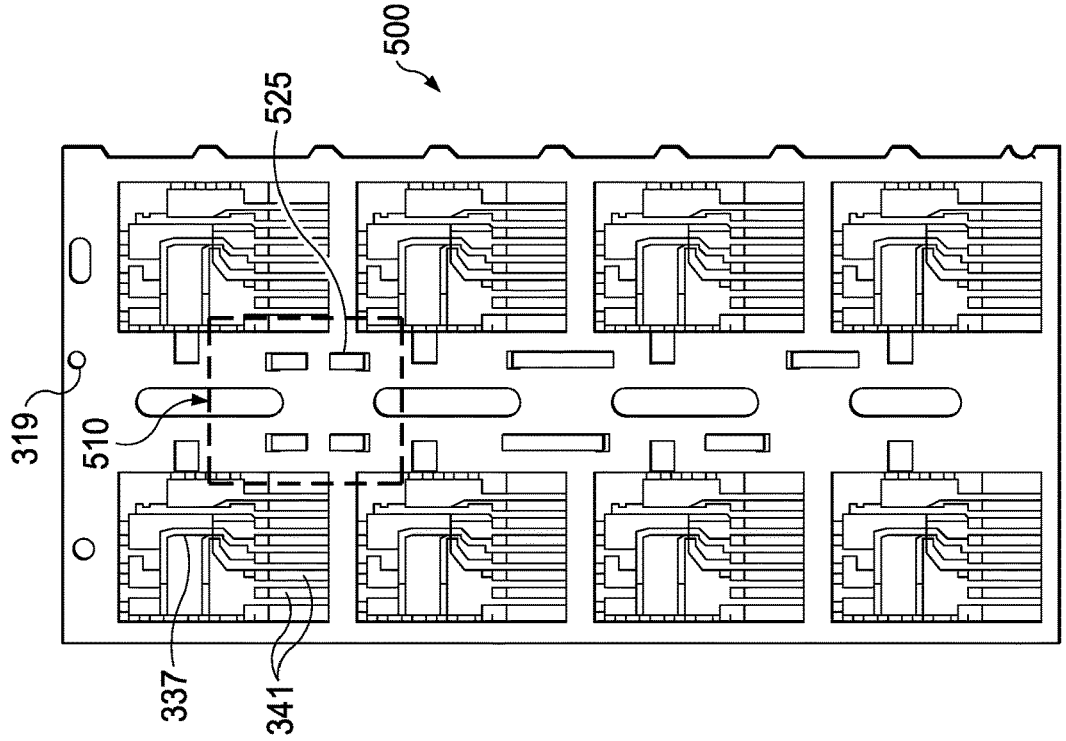
FIG. 5B
FIG. 5A

LOCKING DUAL LEADFRAME FOR FLIP CHIP ON LEADFRAME PACKAGES

CROSS REFERENCE TO RELATED APPLICATIONS

This application is a continuation of U.S. application Ser. No. 14/017,800, filed Sep. 4, 2013 and now abandoned, the contents of which is herein incorporated by reference in its entirety.

BACKGROUND

Leadframe packages are well known and widely used in the electronics industry to house, mount, and interconnect a variety of different integrated circuits (ICs). A conventional leadframe is typically die-stamped from a sheet of flat-stock metal, and includes a plurality of metal leads temporarily held together in a planar arrangement about a central region during package manufacture by a rectangular frame including a plurality of expendable "dam-bars." A mounting die pad for a semiconductor die is supported in the central region by "tie-bars" that attach to the frame. The leads extend from a first end integral with the frame to an opposite second end adjacent to, but spaced apart from the die pad.

In a flip chip on leadframe package, an IC die having solder bumps on its bond pads on the topside of the die is flipped (topside/circuit side) onto a leadframe, where the die is bonded to the die pad and is electrically coupled to the wire bond pads through re-flowing of the solder bumps. One problem with flip chip on leadframe packages resulting in rejected devices is lack of solder ball attachment to the wire bond pads of the leadframe causing electrical opens which can occur due to lack of leadframe co-planarity. One solution to this problem involves increasing the solder ball size which can help somewhat to resolve this issue. However, increasing the solder ball size has disadvantages including an increased incidence of solder ball collapse and solder smearing which each can cause yield loss.

SUMMARY

Disclosed embodiments include a locking dual leadframe (LDLF) which includes a top metal frame portion including a die pad and protruding features and a bottom metal frame portion having apertures positioned lateral to the die pad area sized and positioned so that when the frame portions are pressed together the protruding features penetrate into the apertures to enable a locking feature. The locking feature resists loss of planarity during assembly which helps solve the solder ball detach problem for flip chip on lead package technology caused by lack of leadframe co-planarity noted for known conventional LFs.

Disclosed embodiments recognize the lack of leadframe coplanarity for flip chip on leadframe packages is generally due to leadframe warpage as the leadframe goes through several heated reflow processes. Also, leadframe sheet handing during transfer for each different process during assembly can lead to a loss of leadframe co planarity. With flip chip on leadframe packages having disclosed leadframes including disclosed locking feature(s), warpage is minimized or at least the warpage on the top and bottom metal frame portions is in same direction, so the assembly stack components within the later formed molded package will remain essentially intact during the pre-molding assembly steps.

BRIEF DESCRIPTION OF THE DRAWINGS

Reference will now be made to the accompanying drawings, which are not necessarily drawn to scale, wherein:

FIGS. 4A-D is a top view depiction of a top side of a leadframe sheet, a close up on a section of the bottom side of the top metal frame portion showing a "U" shape feature with side necking, a section 420 of a bottom metal frame portion having apertures comprising circular holes, and a depiction in FIG. 4D of the sections in FIG. 4B and FIG. 4C after being locked together, respectively, demonstrating "U" shape mating, according to an example embodiment.

FIGS. 5A-D is a top view depiction of a top side of a leadframe sheet, a close up on a section of the bottom side of the top metal frame portion showing a linear frame feature, a section of a bottom metal frame portion having apertures a comprising a longitudinal hole, and a depiction in FIG. 5D of the sections in FIG. 5B and FIG. 5C after being locked together, respectively, demonstrating stapler mating, according to an example embodiment.

DETAILED DESCRIPTION

Figure 1:
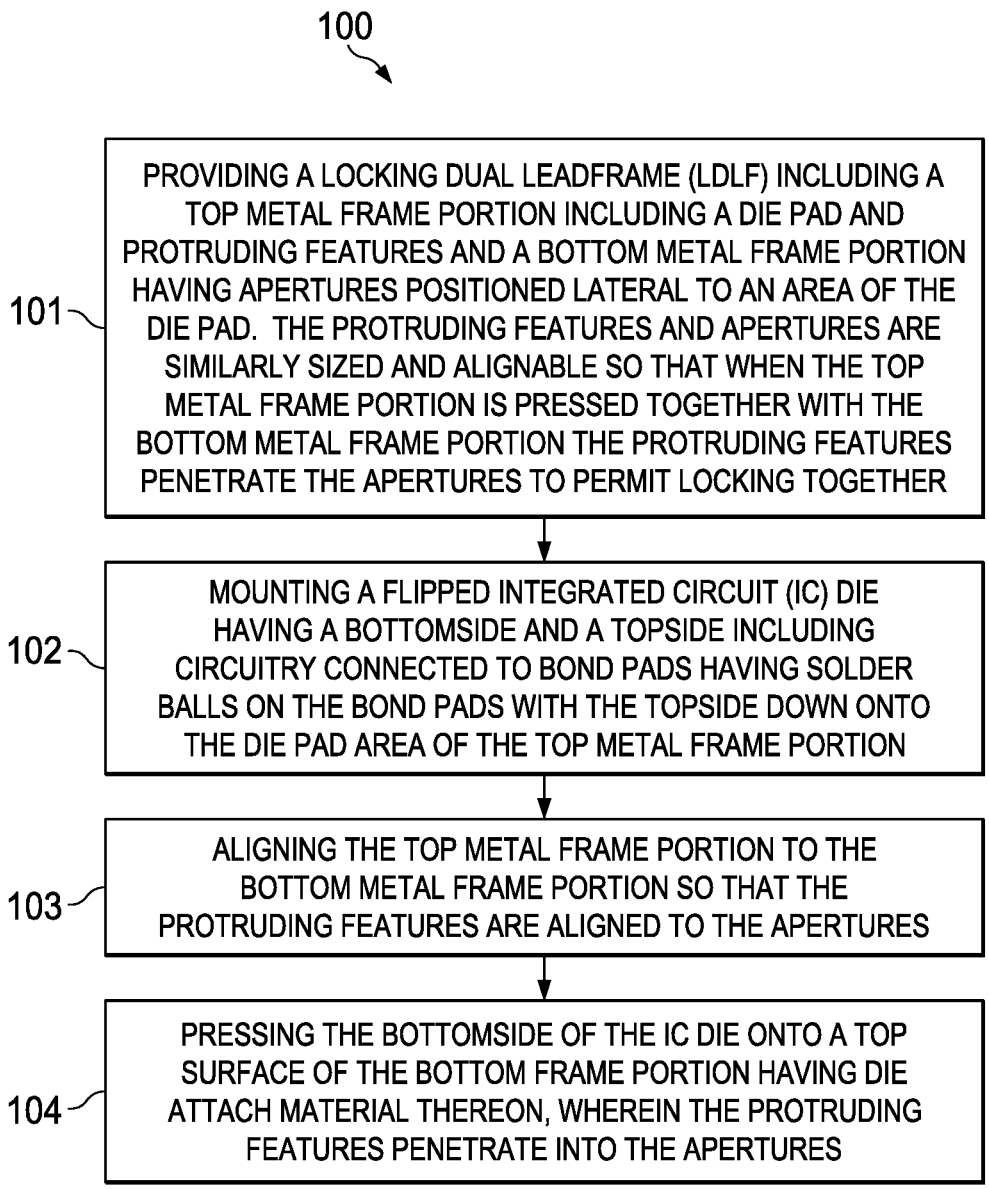
FIG. 1 is a flow chart that shows steps in an example method of assembling a flip chip on a leadframe package using a disclosed LDLF, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of assembling a flip chip on a leadframe package using a disclosed LDLF, according to an example embodiment. Step 101 comprises providing a LDLF including a top metal frame portion including a die pad and protruding features and a bottom metal frame portion having apertures positioned lateral to an area of the die pad. The protruding features and apertures are similarly sized and alignable so that when the top metal frame portion is pressed together with the bottom metal frame portion the protruding features penetrate the apertures to permit locking together. The top metal frame portion and bottom metal frame portion are generally both parts of leadframe sheets including a plurality of frame portions. The top metal frame portion and bottom metal frame portion can both including optional metal plating layers.

The protruding features are generally part of top metal frame portion which can be formed through a metal stamping process, so that the protruding feature are an integral part of the top metal leadframe portion. The protruding features are generally slightly smaller in area as compared to the apertures to permit fitting therethrough and longer than a thickness of the bottom metal frame portion. In one particular embodiment the top metal frame portion and bottom metal frame portion are both about 7 to 9 mm thick, and the protruding features are about 20 mm long.

Step 102 comprises mounting a flipped integrated circuit (IC) die having a bottomside and a topside including circuitry (including transistor(s)) connected to bond pads having solder balls on the bond pads with the topside down onto the die pad area of the top metal frame portion. Step 103 comprises aligning the top metal frame portion to the bottom metal frame portion so that the protruding features are aligned to the apertures. As described below (see pilot holes 319 in FIGS. 3A, 4A and 5A), the respective frame portions can include pilot holes located on top and bottom area of the frame portions which can be used for alignment (e.g., optical alignment) between the respective frame portions.

Figure 6:
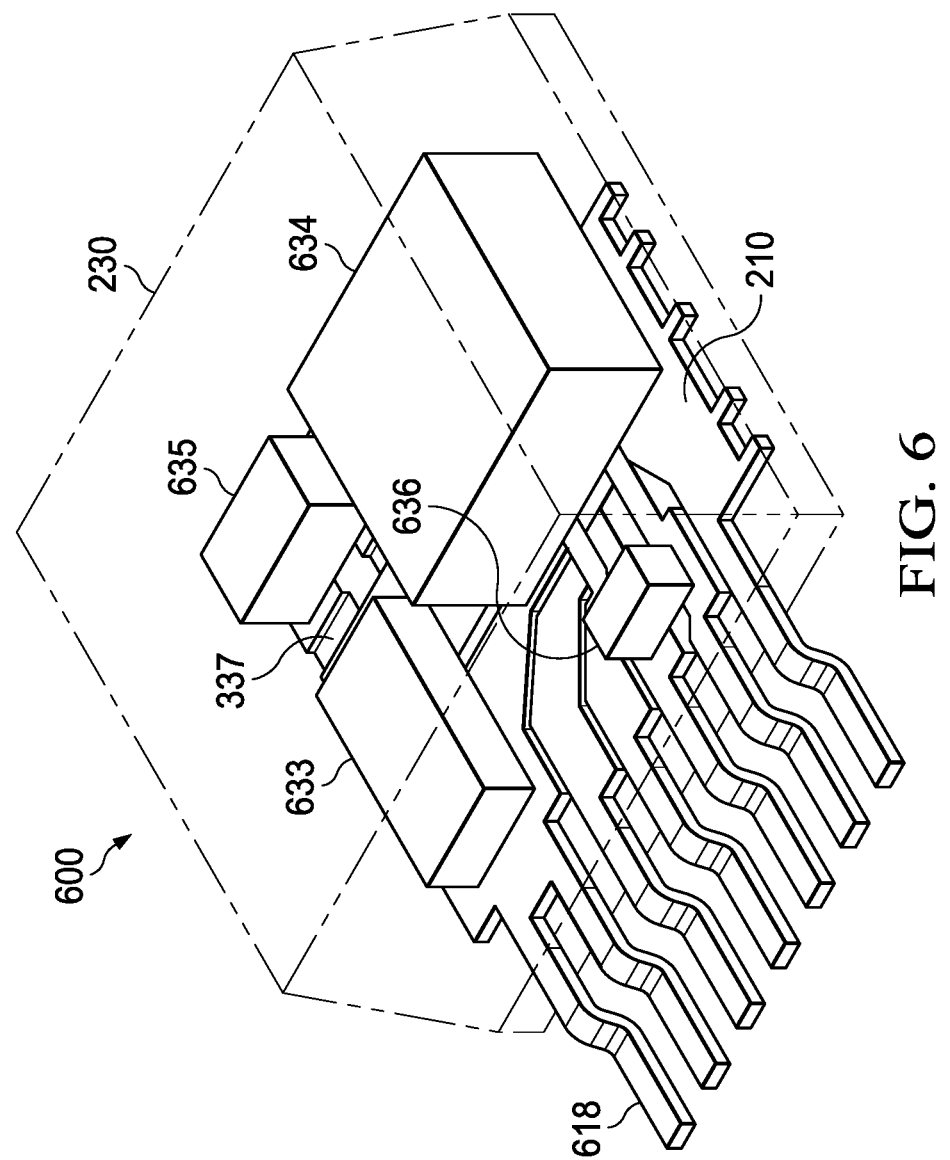
FIG. 6 is a depiction of an example flip chip on a leadframe package after singulation.

Step 104 comprises pressing the bottomside of the IC die onto a top surface of the bottom metal frame portion having a die attach material thereon, wherein the protruding features penetrate into the apertures. A mechanical press can be used for the pressing along with optional heating. Subsequent assembly steps generally include reflowing the solder, molding with a mold material, then singulating the leadframe sheets into individual packaged devices. Singulation cuts around mold material, where the disclosed locking features are generally beyond the mold material and are thus removed by the singulation (e.g., see flip chip on leadframe package 600 in FIG. 6 described below). Embedding the locking features inside the packages is also possible, but when the top metal frame portion includes routing for adding discrete devices (e.g., passives) within the package, such as depicted in FIG. 6, this arrangement may reduce the routing possibilities as it will consume some area that otherwise can be used for routing lines.

Figure 2A:
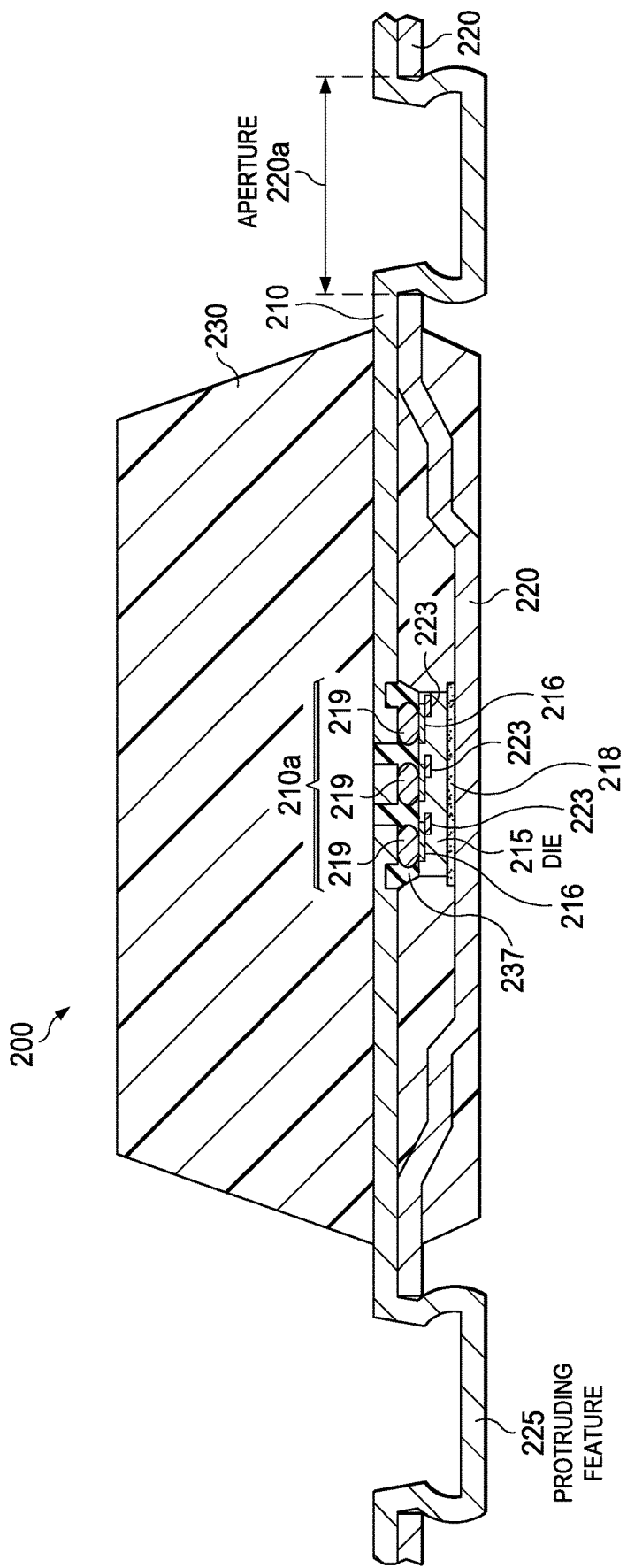
FIG. 2A is a cross sectional depiction of an example flip chip on leadframe package including a disclosed LDLF before singulation, according to an example embodiment.

FIG. 2A is a cross sectional depiction of an example flip chip on leadframe package 200 including a disclosed LDLF before singulation, according to an example embodiment. The LDLF includes a top metal frame portion 210 including protruding features 225 being button shaped including necking (see FIG. 3B described below) and a die pad area 210*a*, and a bottom metal frame portion 220 having apertures 220*a* positioned lateral to the die pad area 210*a* sized and alignable so that when the top metal frame portion 210 is pressed together with the bottom metal frame portion 220 the protruding features penetrate into the apertures 220*a*. The bottom metal frame portion 220 includes a plurality of planar levels as can be seen from the cross-sectional view in FIG. 2A, including three planar levels. One of the planar levels of the bottom metal frame portion 220, where the die 215 is attached to, is referred to as a die pad. In this embodiment the apertures 220*a* can comprise circular holes (see FIG. 3C described below).

An integrated circuit (IC) die 215 has a bottomside and a topside including circuitry 223 connected to bond pads 216 having solder balls 219 on the bond pads 216 mounted flipped with its topside onto the top metal frame portion 210. A die attach material (e.g., an epoxy material) 218 is between the bottomside of the IC die 215 and the bottom metal frame portion 220 for securing the IC die 215 to the bottom metal frame portion 220. Underfill 237 is also shown.

The top metal frame portion 210 is aligned to the bottom metal frame portion 220 so that the protruding features 225 are aligned to the apertures 220*a*. The protruding features 225 are sufficiently long to penetrate into, and generally through the full thickness of the apertures 225*a*. A mold compound (e.g., an epoxy) 230 encapsulates the flip chip on leadframe package 200 except for the bottom of the bottom metal frame portion 220 being exposed to enable an electrical and/or enhanced thermal contact to be made.

Figure 2B:
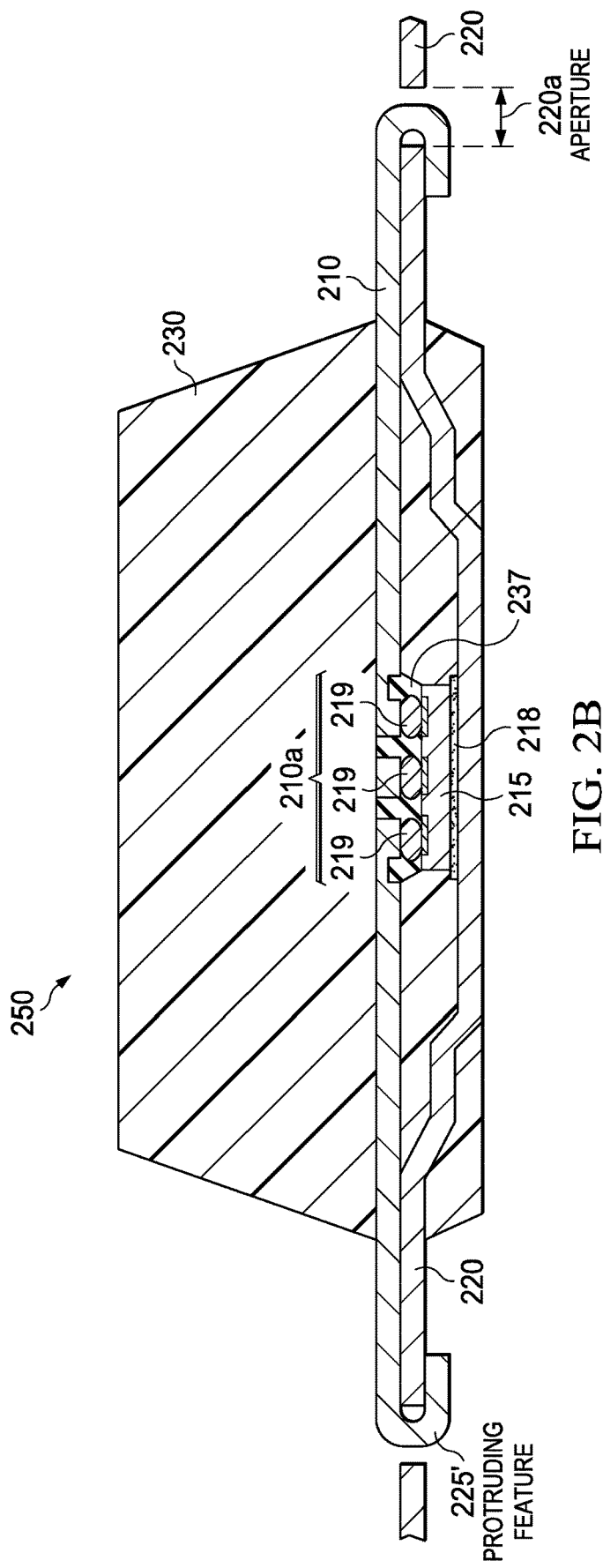
FIG. 2B is a cross sectional depiction of another example flip chip on leadframe package including a disclosed LDLF before singulation, according to an example embodiment.

FIG. 2B is a cross sectional depiction of an example flip chip on leadframe package 250 including a disclosed LDLF before singulation, where the protruding features 225' are in the form a linear frame extending from the top metal frame portion 210 (see FIG. 5B described below) which are bent after being inserted through the apertures 220*a*. In this embodiment the apertures 220*a* can comprise a longitudinal hole (see FIG. 5C described below).

Figures 3B, 3C, 3D:
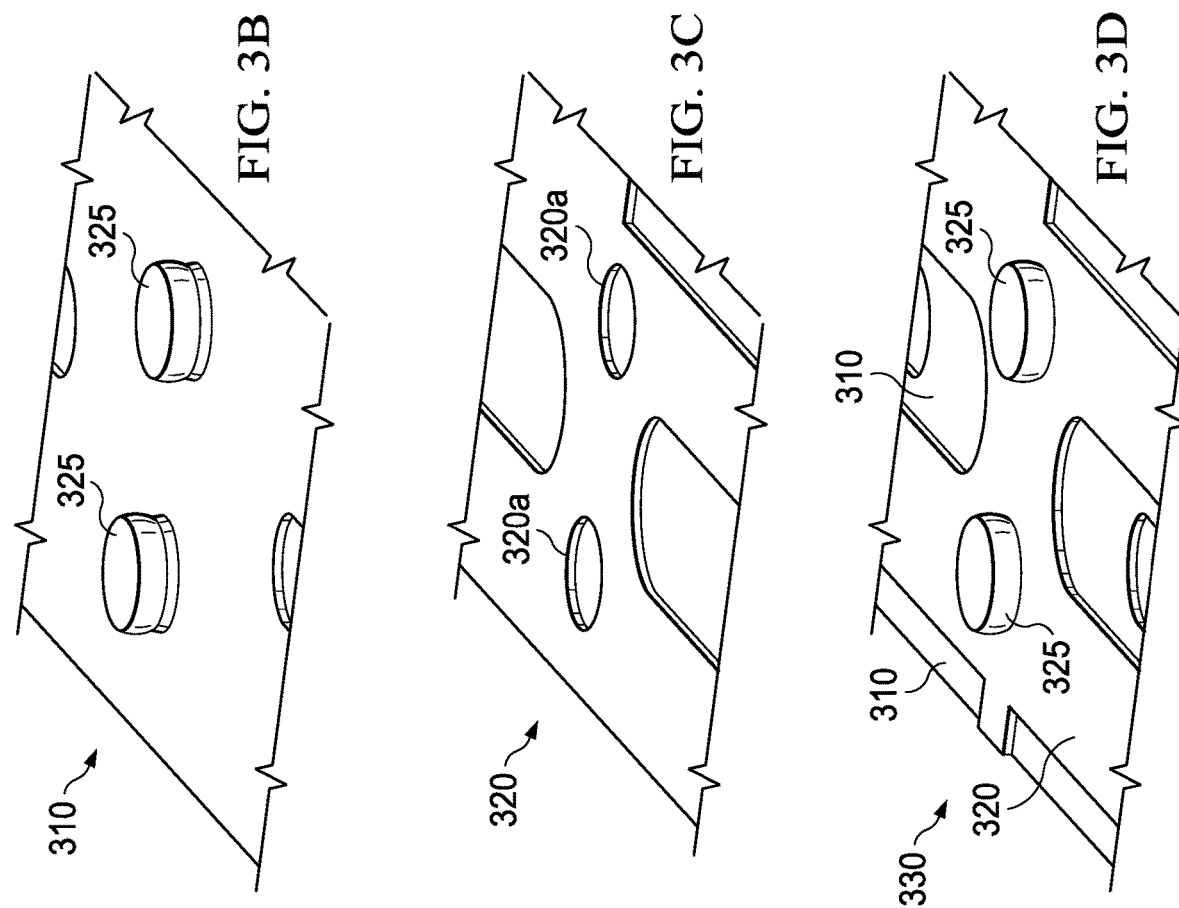
FIGS. 3A-D is a top view depiction of a top side of a leadframe sheet, a close up on a section of the bottom side of the top metal frame portion showing button shaped protruding features including necking, a section of a bottom metal frame portion having apertures comprising circular holes, and a depiction in FIG. 3D of the sections shown in FIG. 3B and FIG. 3C after being locked together, respectively, demonstrating button mating, according to an example embodiment.
Figure 3A:
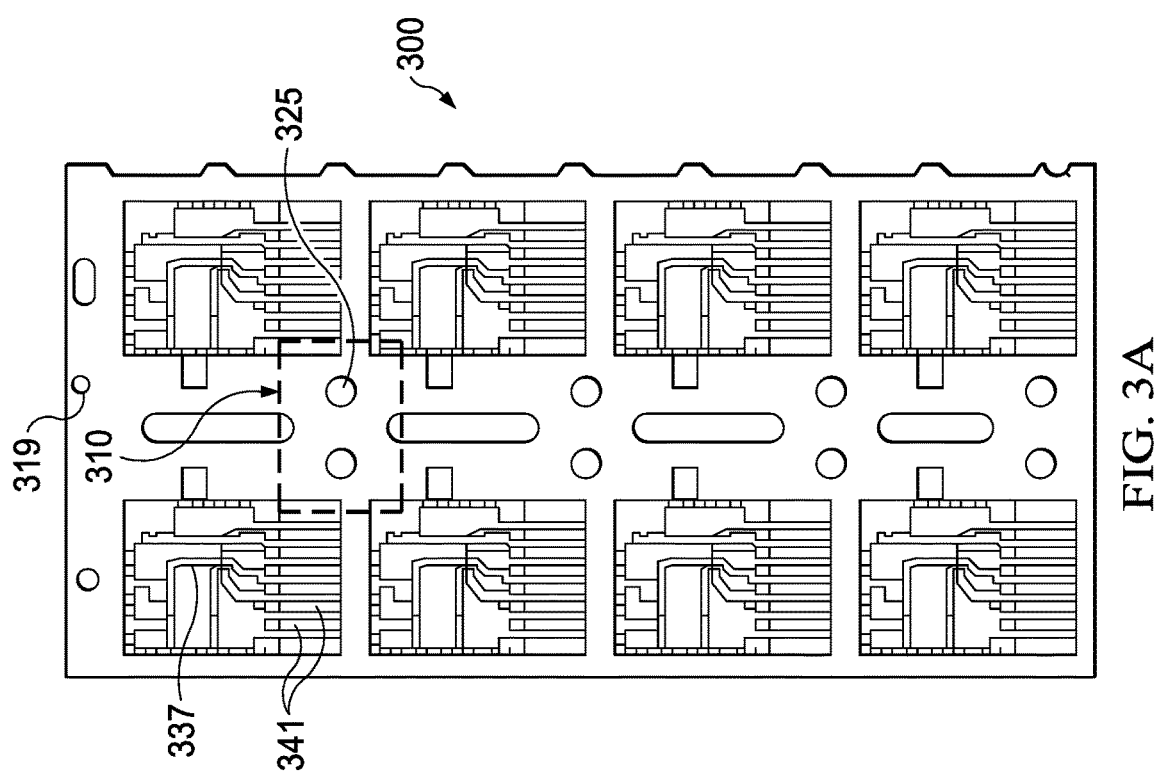

FIGS. 3A-D is a top view depiction of a top side of a leadframe sheet 300, a close up on a section 310 of the bottom side of the top metal frame portion showing button shaped protruding features 325 including necking, a section 320 of a bottom metal frame portion having apertures comprising circular holes 320*a*, and in FIG. 3D a depiction 330 of the sections in FIG. 3B and FIG. 3C after being locked together, respectively, demonstrating button mating according to an example embodiment. Routing 337 is shown on the top side of the top metal frame portion that enables connection between components such as passive devices (e.g., capacitors) and the leads 341 of the leadframe.

Pilot holes 319 are shown for aligning the top metal frame portion and a bottom metal frame portion. The circular holes 320*a* on bottom frame portion enable the button shaped protruding features 325 including necking to lock together as shown in FIG. 3D. The leadframe sheet 300 includes eight (8) top metal frame portions as an example only.

FIGS. 4A-D is a top view depiction of a top side of a leadframe sheet 400, a close up on a section 410 of the bottom side of the top metal frame portion showing a "U" shape feature 425 with side necking, a section 420 of a bottom metal frame portion having apertures 420*a* comprising rectangular holes, and in FIG. 4D a depiction 430 of the sections in FIG. 4B and FIG. 4C after being locked together, respectively, demonstrating "U" shape mating, according to an example embodiment. Apertures 420*a* on the bottom metal frame enables the "U" shape features 425 on the top metal frame to lock together. The leadframe sheet 400 includes eight (8) top metal frame portions as an example only.

Figure 5C:
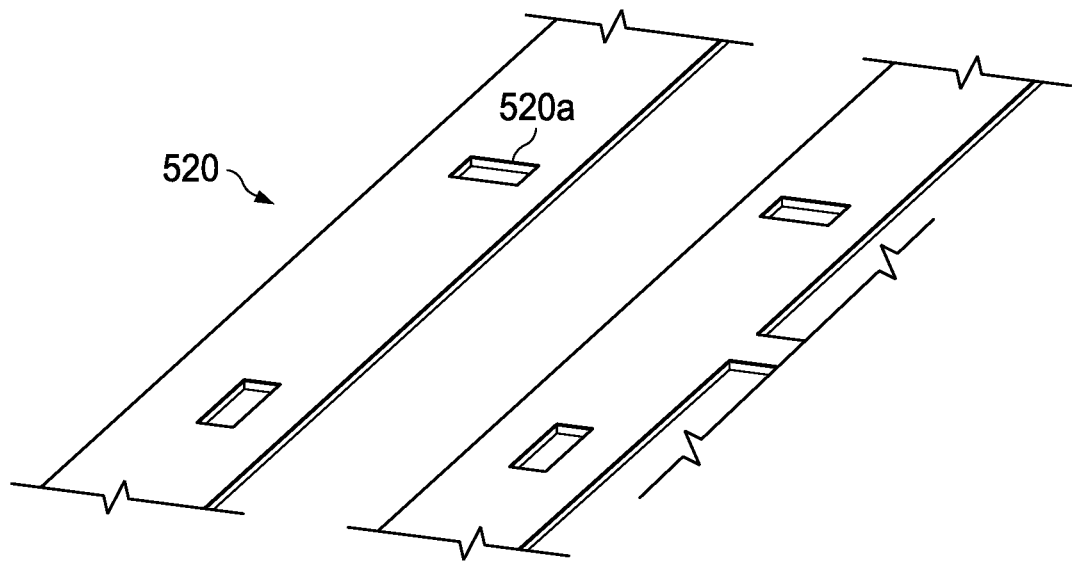
Figure 5D:
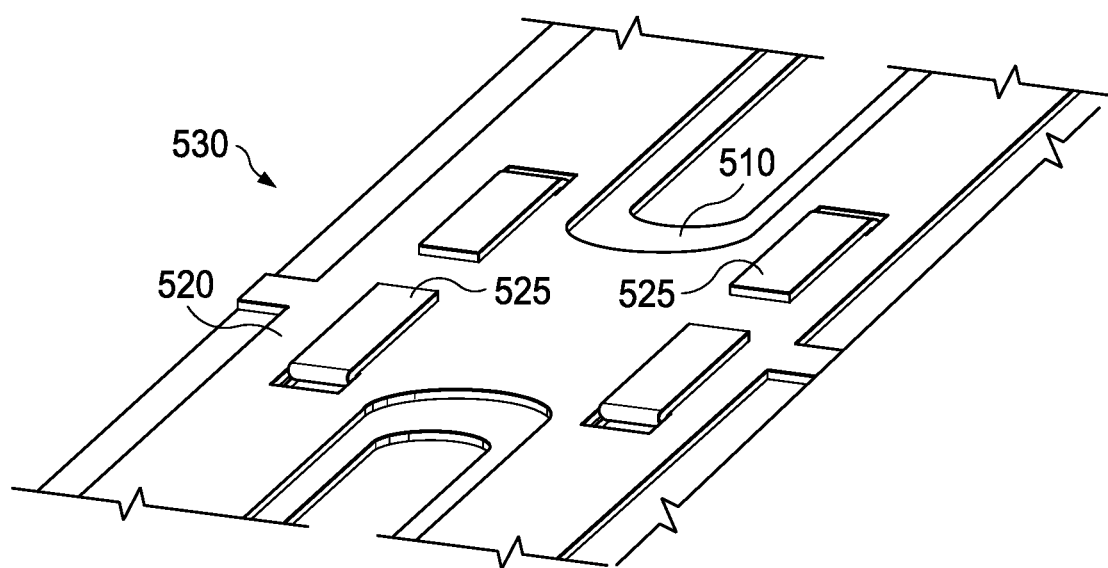

FIGS. 5A-D is a top view depiction of a top side of a leadframe sheet 500, a close up on a section 510 of the bottom side of the top metal frame portion showing a linear frame feature 525, a section 520 of a bottom metal frame portion having apertures 520*a* comprising a longitudinal hole, and in FIG. 5D a depiction 530 of the sections in FIG. 5B and FIG. 5C after being locked together, respectively, demonstrating stapler mating according to an example embodiment. The linear frame features 525 are shown in FIG. 5B in a rectangular shape. The longitudinal hole shaped apertures 520*a* on bottom frame enable the linear frame feature 525 to enter the apertures 520*a* and then be bent as shown in FIG. 5D (analogous to a staple) to lock the linear frame feature 525 on the top metal frame portion and the apertures 520*a* on the bottom metal frame portion together.

The leadframe sheet 500 includes eight (8) top metal frame portions as an example only.

FIG. 6 is a depiction of an example flip chip on a leadframe package 600 after singulation. The top metal frame portion 210 is shown including components 633, 634, 635 and 636 which are connected by routing 337 on top metal frame portion 210 for coupling to the lead fingers 618. Although not able to be shown in FIG. 6, the side of the top metal frame portion 210 opposite the components 633-636 has an IC mounted thereto, and there is a bottom metal frame portion thereunder.

Advantages of disclosed embodiments include the protrusion features on the top metal frame portion with necking locking together to secure the top and bottom metal frame portions together during assembly. Disclosed leadframe locking avoid leadframes from moving in the X and Y direction (along the plane of the leadframes) during assembly processing, and helps ensure no separation between the top and bottom metal frame portions in the Z direction. Disclosed leadframes having mated metal frames portions are rigid and stable ensuring essentially no misalignment of leadframes from subsequent assembly processes, and thus a significant reduction in rejected devices for lack of solder ball attachment to the wire bond pads of the leadframe causing electrical opens.

Disclosed embodiments can be integrated into a variety of assembly flows to form a variety of different semiconductor integrated circuit (IC) devices and related products. The assembly can comprise single semiconductor die or multiple semiconductor die, such as package-on-package (PoP) configurations comprising a plurality of stacked semiconductor die. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated circuit package comprising:
   a locking dual lead frame including:
      a first metal frame; and
      a second metal frame attached to the first metal frame, the second metal frame including a plurality of planar levels, one of the plurality of planar levels including a die pad;
   a die on the die pad, the die in between the first metal frame and the second metal frame;
   under fill material between portions of the die and the first metal frame; and
   mold compound covering portions of the die, the under fill material, and the locking dual lead frame.

2. The integrated circuit package of claim 1, wherein the first metal frame includes a plurality of leads.

3. The integrated circuit package of claim 1, wherein the first metal frame and the second metal frame both include pilot holes for aligning the first metal frame to the second metal frame.

4. The integrated circuit package of claim 1, wherein the die is electrically connected to the first metal frame and mechanically attached to the second metal frame.

5. The integrated circuit package of claim 1, wherein the die is electrically connected to the first metal frame via solder balls.

6. The integrated circuit package of claim 5, wherein the solder balls connect to a plurality of bond pads of the die.

7. The integrated circuit package of claim 1, wherein the first metal frame includes protruding features and the second metal frame includes apertures, the protruding features penetrated into the apertures, wherein the protruding features and the apertures are removed during singulation.

8. The integrated circuit package of claim 7, wherein the apertures include a longitudinal hole and the protruding features include a linear frame.

9. The integrated circuit package of claim 7, wherein the apertures include a circular hole and the protruding features include a button shape.

10. The integrated circuit package of claim 7, wherein the apertures include a longitudinal hole and the protruding features include a U shape with side necking.

11. The integrated circuit package of claim 1, wherein plurality of planar levels is connected by a plurality of portions that are at an angle with respect to the plurality of planar levels.

12. An integrated circuit package comprising:
   a locking dual lead frame including:
      a first metal frame including a plurality of leads; and
      a second metal frame attached to the first metal frame, the second metal frame including a plurality of planar levels connected by a plurality of portions that are at an angle with respect to the plurality of planar levels, one of the plurality of planar levels including a die pad;
   a die on the die pad, the die in between the first metal frame and the second metal frame;
   under fill material between portions of the die and the first metal frame; and
   mold compound covering portions of the die, the under fill material, and the locking dual lead frame.

13. The integrated circuit package of claim 12, wherein the plurality of planar levels includes at least three planar levels.

14. The integrated circuit package of claim 12, wherein a portion of the second metal frame is exposed from the integrated circuit package.

15. The integrated circuit package of claim 12, wherein the die is electrically connected to the first metal frame and mechanically attached to the second metal frame.

16. The integrated circuit package of claim 12, wherein the die is electrically connected to the first metal frame via solder balls.

17. The integrated circuit package of claim 12, wherein the first metal frame and the second metal frame are between 7 and 9 mm in thickness.

18. The integrated circuit package of claim 12, wherein the first metal frame includes protruding features and the second metal frame includes apertures, the protruding features penetrated into the apertures, wherein the protruding features and the apertures are removed during singulation.

19. The integrated circuit package of claim 18, wherein the apertures include one of a circular hole and a longitudinal hole, and the protruding features includes one of a U shape with side necking, a linear frame, and a button shape.

20. An integrated circuit package comprising:
a locking dual lead frame including:
- a first metal frame; and
- a second metal frame attached to the first metal frame, the second metal frame including a plurality of planar levels, one of the plurality of planar levels including a die pad;

a die on the die pad, the die in between the first metal frame and the second metal frame;

under fill material between portions of the die and the first metal frame; and mold compound covering portions of the die, the under fill material, and the locking dual lead frame, wherein the plurality of planar levels is within the mold compound.

* * * * *